(12) United States Patent
Yun et al.

(10) Patent No.: US 12,519,050 B2
(45) Date of Patent: Jan. 6, 2026

(54) DOUBLE-SIDED REDISTRIBUTION LAYER (RDL) SUBSTRATE FOR PASSIVE AND DEVICE INTEGRATION

(71) Applicant: QUALCOMM Incorporated, San Diego, CA (US)

(72) Inventors: Changhan Hobie Yun, San Diego, CA (US); Nosun Park, Incheon (KR); Daniel Daeik Kim, San Diego, CA (US); Paragkumar Ajaybhai Thadesar, San Diego, CA (US); Sameer Sunil Vadhavkar, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 149 days.

(21) Appl. No.: 17/579,038

(22) Filed: Jan. 19, 2022

(65) Prior Publication Data

US 2023/0230910 A1 Jul. 20, 2023

(51) Int. Cl.
| | |
|---|---|
| *H01L 23/498* | (2006.01) |
| *H01L 21/48* | (2006.01) |
| *H01L 23/00* | (2006.01) |
| *H01L 23/48* | (2006.01) |
| *H01L 23/522* | (2006.01) |

(52) U.S. Cl.
CPC ...... *H01L 23/49827* (2013.01); *H01L 21/486* (2013.01); *H01L 23/481* (2013.01); *H01L 23/49816* (2013.01); *H01L 23/5223* (2013.01); *H01L 24/14* (2013.01); *H01L 2924/15311* (2013.01)

(58) Field of Classification Search
CPC ............. H01L 23/49827; H01L 21/486; H01L 23/481; H01L 23/49816; H01L 23/5223; H01L 24/14; H01L 2924/15311
See application file for complete search history.

(56) References Cited

U.S. PATENT DOCUMENTS

| | | | |
|---|---|---|---|
| 10,867,892 B1* | 12/2020 | Chang | H10N 19/00 |
| 2016/0247761 A1 | 8/2016 | Song et al. | |
| 2017/0256480 A1 | 9/2017 | Reingruber et al. | |
| 2018/0054177 A1* | 2/2018 | Mudakatte | H05K 1/165 |
| 2018/0315706 A1* | 11/2018 | Liao | H01L 23/3128 |
| 2020/0098693 A1* | 3/2020 | Jeng | H01L 25/105 |
| 2021/0066204 A1* | 3/2021 | Oh | H01L 24/08 |
| 2021/0104447 A1* | 4/2021 | Kim | H01L 24/16 |
| 2021/0225780 A1* | 7/2021 | Wu | H01L 23/49816 |
| 2021/0280523 A1* | 9/2021 | We | H01L 21/4853 |
| 2021/0391284 A1* | 12/2021 | Hsu | H01L 23/3128 |

(Continued)

OTHER PUBLICATIONS

International Search Report and Written Opinion—PCT/US2022/050772—ISA/EPO—Aug. 7, 2023.

(Continued)

*Primary Examiner* — Kretelia Graham
*Assistant Examiner* — Jaesun Lee
(74) *Attorney, Agent, or Firm* — Seyfarth Shaw LLP

(57) ABSTRACT

A device includes a redistribution layer (RDL) substrate. The device also includes a passive component in the RDL substrate proximate a first surface of the RDL substrate. The device further includes a first die coupled to a second surface of the RDL substrate, opposite the first surface of the RDL substrate.

8 Claims, 13 Drawing Sheets

(56) References Cited

U.S. PATENT DOCUMENTS

2022/0223516 A1* 7/2022 Park .................. H01L 27/01
2022/0246552 A1* 8/2022 Yun .................... H04B 1/18
2022/0406882 A1* 12/2022 Kim .................. H01L 23/66

OTHER PUBLICATIONS

Partial International Search Report—PCT/US2022/050772—ISA/EPO—Apr. 20, 2023.
Sundaram V., et al., "Interposer Technology", Chapter 4, Wiley, Online Library, First published, Jun. 4, 2014, pp. 41-63.

* cited by examiner

DOUBLE-SIDED REDISTRIBUTION LAYER (RDL) SUBSTRATE FOR PASSIVE AND DEVICE INTEGRATION

BACKGROUND

Field

Aspects of the present disclosure relate to semiconductor devices and, more particularly, to a wafer-level, double-sided redistribution layer (RDL) substrate for passive and active device integration.

Background

Wireless communications devices incorporate radio frequency (RF) modules that facilitate the communication and features users expect. As wireless systems become more prevalent and include more capabilities, the chips become more complex. Fifth generation (5G) new radio (NR) wireless communications devices incorporate the latest generation of electronic dies that are packed into smaller modules with smaller interconnections. Design challenges include integrating passive devices and active devices to implement RF front-end modules (FEMs).

An RF front-end module may be implemented by integrating RF filters, active devices, and surface-mount technology (SMT) devices on a laminate substrate. These RF filters, active devices, and SMT devices are conventionally arranged in a side-by-side package configuration supported by a laminate substrate. Unfortunately, these conventional side-by-side on package laminate configurations are subjected to decreasing XY size and Z height limitations due to the reduced form factor of future applications. That is, the XY size and Z height dimensions of conventional side-by-side on package laminate configurations exceed the form factor of future RF front-end module applications. An RF front-end implementation that meets reduced XY size and Z height dimensions specified by the form factor of future RF front-end module applications is desired.

SUMMARY

A device includes a redistribution layer (RDL) substrate. The device also includes a passive component in the RDL substrate proximate a first surface of the RDL substrate. The device further includes a first die coupled to a second surface of the RDL substrate, opposite the first surface of the RDL substrate.

A method for fabricating a device is described. The method includes forming a redistribution layer (RDL) substrate on a carrier glass substrate. The method also includes forming a passive component in an interlayer dielectric (ILD) layer of the RDL substrate proximate a first surface of the RDL substrate and the carrier glass substrate. The method further includes coupling a first die to a second surface of the RDL substrate, opposite the first surface of the RDL substrate. The method also includes removing the carrier glass substrate from the first surface of the RDL substrate.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
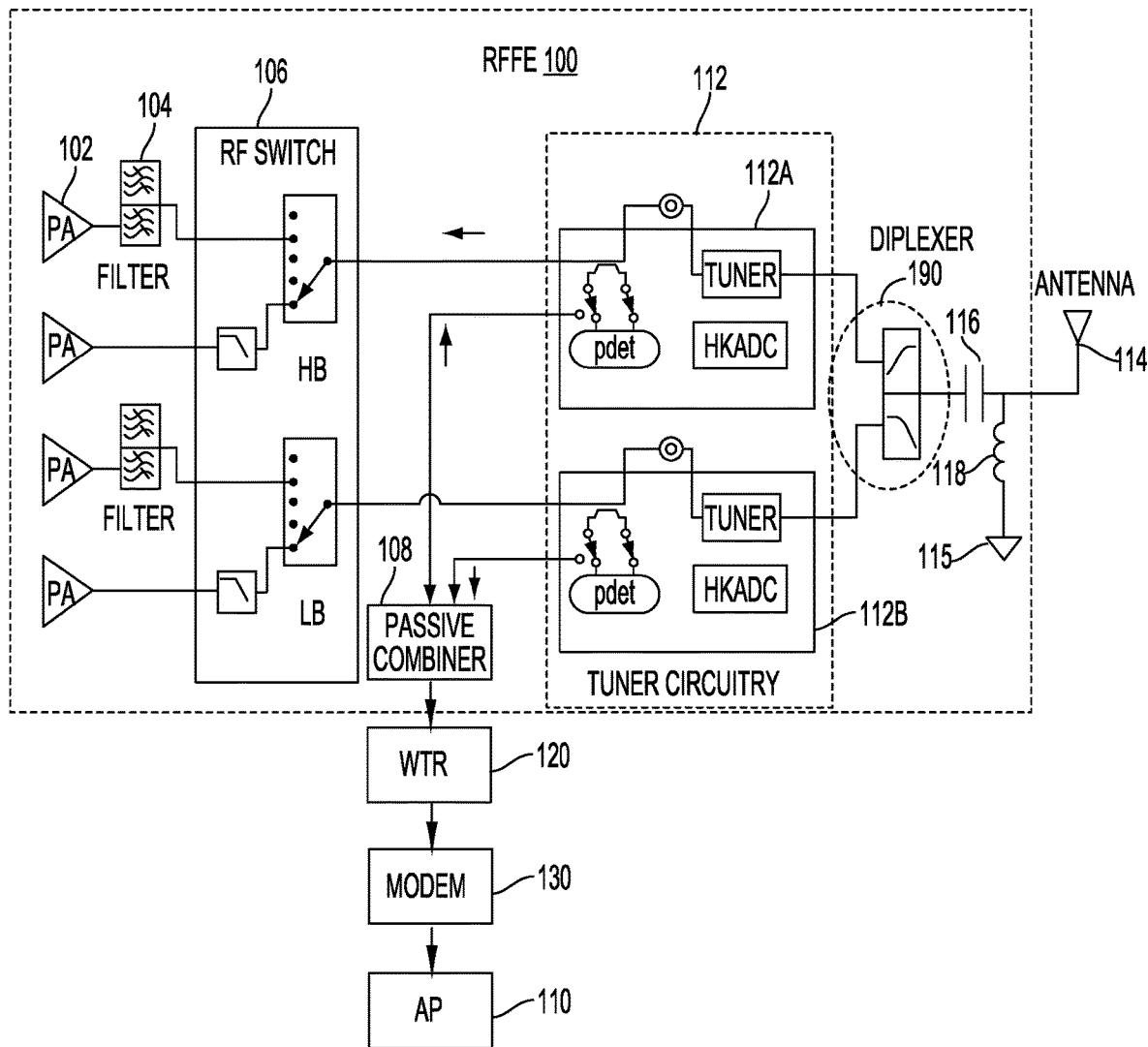
FIG. 1 is a schematic diagram of a radio frequency front-end (RFFE) module employing active and passive devices.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR," and the use of the term "or" is intended to represent an "exclusive OR." As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Wireless communications devices incorporate radio frequency (RF) modules that facilitate the communication and features users expect. As wireless systems become more prevalent and include more capabilities, the chips become more complex. For example, mobile RF chips (e.g., mobile RF transceivers) have migrated to a deep sub-micron process node due to cost and power consumption considerations. Designing mobile RF transceivers is complicated by added circuit functions for supporting communications enhancements, such as fifth generation (5G) new radio (NR) communications systems. In particular, 5G NR wireless communications devices incorporate the latest generation of electronic dies that are packed into smaller modules with smaller interconnections. Design challenges include integrating passive devices and active devices to implement RF front-end modules (FEMs).

RF filters in mobile RF transceivers may include high performance capacitor and inductor components. For example, RF filters use various types of passive devices, such as integrated capacitors and integrated inductors. Integrated capacitors may include metal-oxide-semiconductor (MOS) capacitors, p-n junction capacitors, metal-insulator-metal (MIM) capacitors, poly-to-poly capacitors, metal-oxide-metal (MOM) capacitors, and other like capacitor structures. Capacitors are generally passive elements used in integrated circuits for storing an electrical charge. For example, parallel plate capacitors are often made using plates or structures that are conductive with an insulating material between the plates.

An inductor is an example of an electrical device used to temporarily store energy in a magnetic field within a wire coil according to an inductance value. This inductance value provides a measure of the ratio of voltage to the rate of change of current passing through the inductor. When the current flowing through an inductor changes, energy is temporarily stored in a magnetic field in the coil. In addition to their magnetic field storing capability, inductors are often used in alternating current (AC) electronic equipment, such as radio equipment. For example, the design of mobile RF transceivers includes the use of inductors with improved inductance density while reducing magnetic loss at millimeter wave (mmW) frequencies (e.g., frequency range two (FR2)).

A radio frequency front-end (RFFE) module may include a 5G broadband FR2 filter including MIM capacitors and inductors. In practice, an RFFE module may be implemented by integrating RF filters, active devices, and surface-mount technology (SMT) devices on a laminate substrate. These RF filters, active devices, and SMT devices are conventionally arranged in a side-by-side package configuration supported by a laminate substrate. Unfortunately, this conventional side-by-side on package laminate configuration is subjected to decreasing XY size and Z height limitations due to the reduced form factor of future RF applications. That is, the XY size and Z height dimensions of conventional side-by-side on package laminate configurations exceed the form factor of future RFFE module applications. An RFFE implementation that meets reduced XY size and Z height dimensions specified by the form factor of future RFFE module applications is desired.

Various aspects of the disclosure provide a wafer-level, double-sided redistribution layer (RDL) substrate for passive and active device integration. The process flow for fabrication of the RDL substrate may include wafer-level processes, such as front-end-of-line (FEOL) processes, middle-of-line (MOL) processes, and back-end-of-line (BEOL) processes. It will be understood that the term "layer" includes film and is not construed as indicating a vertical or horizontal thickness unless otherwise stated. As described, the term "substrate" may refer to a substrate of a diced wafer or may refer to a substrate of a wafer that is not diced. Similarly, the terms chip and die may be used interchangeably.

As described, the back-end-of-line (BEOL) interconnect layers may refer to the conductive interconnect layers (e.g., a first interconnect layer (M1) or metal one M1, metal two (M2), metal three (M3), metal four (M4), etc.) for electrically coupling to front-end-of-line (FEOL) active devices of an integrated circuit. The various BEOL interconnect layers are formed at corresponding BEOL interconnect layers, in which lower BEOL interconnect layers use thinner metal layers relative to upper BEOL interconnect levels. The BEOL interconnect layers may electrically couple to middle-of-line (MOL) interconnect layers, for example, to connect M1 to an oxide diffusion (OD) layer of an integrated circuit. The MOL interconnect layer may include a zero interconnect layer (M0) for connecting M1 to an active device layer of an integrated circuit. A BEOL first via (V2) may connect M2 to M3 or others of the BEOL interconnect layers. The BEOL vias may also provide a via pad (VP) to support package (or device) interconnects, such as package balls.

According to aspects of the present disclosure, an RFFE module includes a redistribution layer (RDL) substrate. In addition, the RFFE module includes a passive component in the RDL substrate proximate a first surface of the RDL substrate. In some aspects of the present disclosure, the RFFE module includes a first die coupled to a second surface of the RDL substrate, opposite the first surface of the RDL substrate. In some aspects of the present disclosure, the RFFE module includes a second die coupled to the passive component, opposite the first die. In a multi-die configuration, the RFFE module includes a third die coupled to the passive component, opposite the first die and proximate the second die. In some aspects of the present disclosure, the first die, second die, and the third die may provide active components of an antenna module, such as an RF switch.

FIG. 1 is a schematic diagram of a radio frequency front-end (RFFE) module 100 employing a redistribution layer (RDL) substrate integrating active and passive devices, according to aspects of the present disclosure. The RFFE module 100 includes power amplifiers 102, duplexer/filters 104, and a radio frequency (RF) switch module 106. The power amplifiers 102 amplify signal(s) to a certain power level for transmission. The duplexer/filters 104 filter the input/output signals according to a variety of different parameters, including frequency, insertion loss, rejection, or other like parameters. In addition, the RF switch module 106 may select certain portions of the input signals to pass on to the rest of the RFFE module 100.

The radio frequency front-end (RFFE) module 100 also includes tuner circuitry 112 (e.g., first tuner circuitry 112A and second tuner circuitry 112B), the diplexer 190, a capacitor 116, an inductor 118, a ground terminal 115, and an antenna 114. The tuner circuitry 112 (e.g., the first tuner circuitry 112A and the second tuner circuitry 112B) includes components such as a tuner, a portable data entry terminal (PDET), and a housekeeping analog-to-digital converter (HKADC). The tuner circuitry 112 may perform impedance tuning (e.g., a voltage standing wave ratio (VSWR) optimization) for the antenna 114. The RFFE module 100 also includes a passive combiner 108 coupled to a wireless transceiver (WTR) 120. The passive combiner 108 combines the detected power from the first tuner circuitry 112A and the second tuner circuitry 112B. The wireless transceiver 120 processes the information from the passive combiner 108 and provides this information to a modem 130 (e.g., a mobile station modem (MSM)). The modem 130 provides a digital signal to an application processor (AP) 140.

As shown in FIG. 1, the diplexer 190 is between the tuner component of the tuner circuitry 112 and the capacitor 116, the inductor 118, and the antenna 114. The diplexer 190 may be placed between the antenna 114 and the tuner circuitry 112 to provide high system performance from the radio frequency front-end (RFFE) module 100 to a chipset including the wireless transceiver 120, the modem 130, and the application processor 110. The diplexer 190 also performs frequency domain multiplexing on both high band frequencies and low band frequencies. After the diplexer 190 performs its frequency multiplexing functions on the input signals, the output of the diplexer 190 is fed to an optional inductor/capacitor (LC) network including the capacitor 116 and the inductor 118. The LC network may provide extra impedance matching components for the antenna 114, when desired. Then, a signal with the particular frequency is transmitted or received by the antenna 114. Although a single capacitor and inductor are shown, multiple components are also contemplated.

Figure 2:
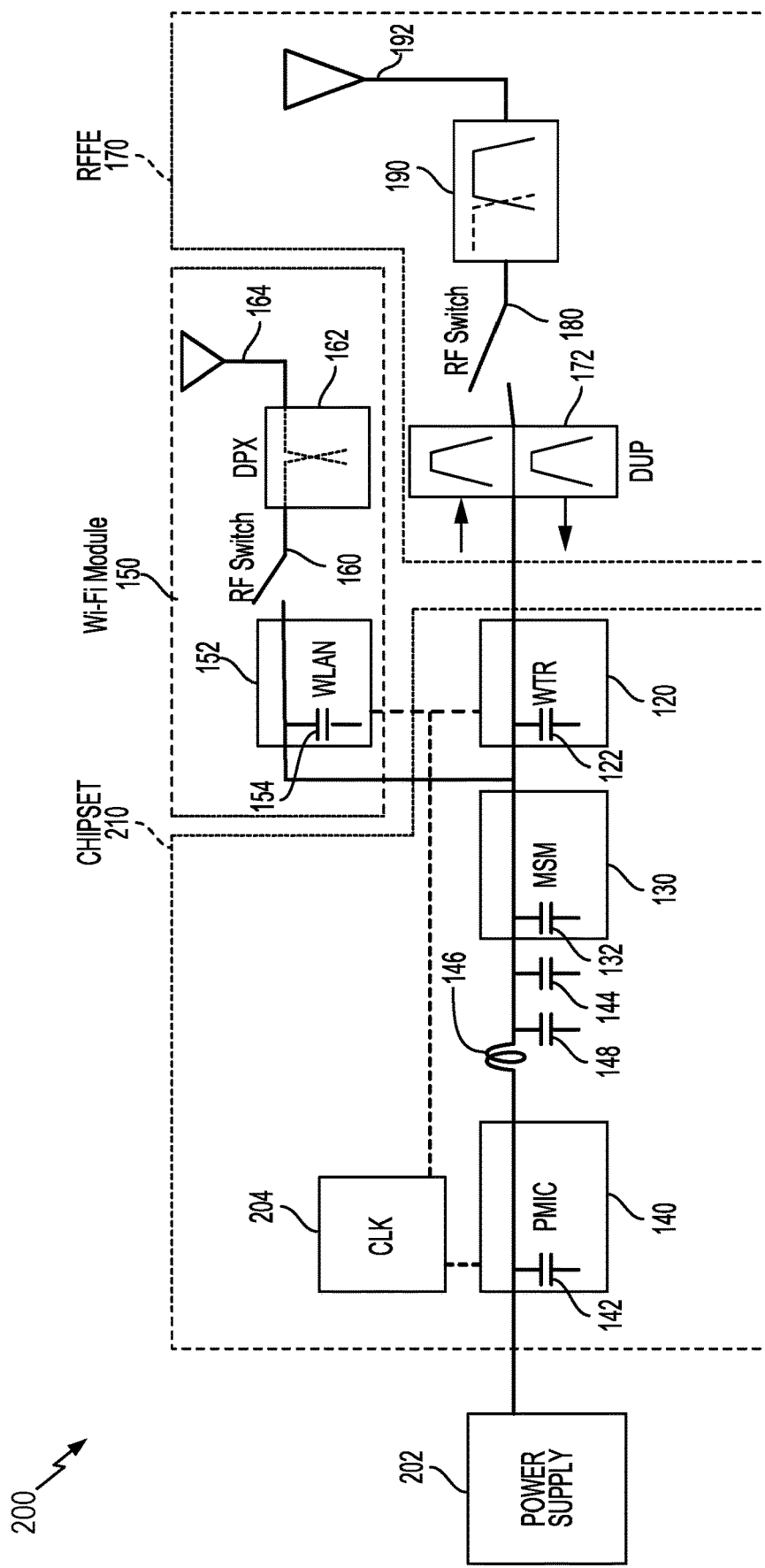
FIG. 2 is a schematic diagram of a radio frequency front-end (RFFE) module employing active and passive devices for a chipset.

FIG. 2 is a schematic diagram of a radio frequency integrated circuit (RFIC) chip 200, having a wireless local area network (WLAN) (e.g., Wi-Fi) module 150 and a radio frequency front-end (RFFE) module 170 for a chipset 210. The Wi-Fi module 150 includes a first diplexer 162 communicably coupling an antenna 164 to a WLAN module 152. A first RF switch 160 communicably couples the first diplexer 162 to the WLAN module 152. The RFFE module 170 includes a second diplexer 190 communicably coupling an antenna 192 to a wireless transceiver (WTR) 120 through a duplexer 172. A second RF switch 180 communicably couples the second diplexer 190 to the duplexer 172.

The WTR 120 and the WLAN module 152 of the Wi-Fi module 150 are coupled to a modem (mobile station modem (MSM), e.g., baseband modem) 130 that is powered by a power supply 202 through a power management integrated circuit (PMIC) 140. The chipset 210 also includes capacitors 144 and 148, as well as an inductor(s) 146 to provide signal integrity. The PMIC 140, the modem 130, the WTR 120, and the WLAN module 152 each include capacitors (e.g., 142, 132, 122, and 154) and operate according to a clock 204. In addition, the inductor 146 couples the modem 130 to the PMIC 140. The geometry and arrangement of the various inductor and capacitor components in the RFIC) chip 200 may reduce the electromagnetic coupling between the components.

The WTR 120 of the wireless device generally includes a mobile RF transceiver to transmit and receive data for two-way communications. The WTR 120 and the RFFE module 170 may be implemented using high performance complementary metal oxide semiconductor (CMOS) RF switch technologies to implement switch transistors of the first RF switch 160 and the second RF switch 180. The RFFE module 170 may rely on these high performance CMOS RF switch technologies to implement an active die for successful operation. In practice, the active die used to implement the CMOS RF switch technology may involve integration with a passive RF filter to implement an antenna module, for example, as shown in FIG. 3.

Figure 3:
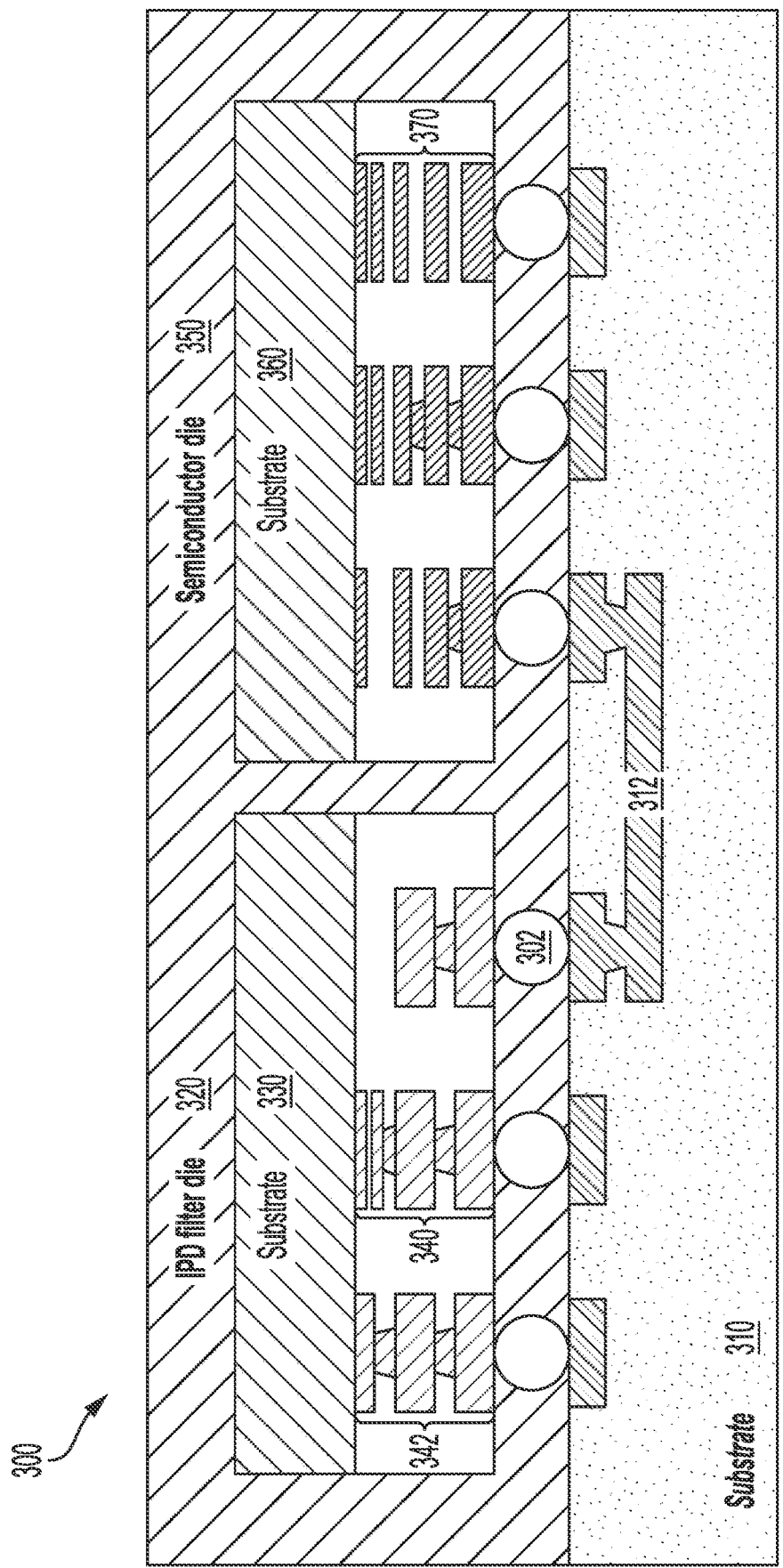
FIG. 3 is a block diagram illustrating a cross-sectional view of a radio frequency front-end (RFFE) module including a semiconductor die and an integrated passive device (IPD) filter die, in accordance with aspects of the present disclosure.

FIG. 3 is a block diagram illustrating a cross-sectional view of a radio frequency front-end (RFFE) module 300 including a semiconductor die and an integrated passive device (IPD) filter die, in accordance with aspects of the present disclosure. In this example, the RFFE module 300 includes a semiconductor die 350 and an IPD filter die 320 supported by a package substrate 310 (e.g., a laminate substrate). The semiconductor die 350 may be an active die having a semiconductor substrate 360 (e.g., an active silicon substrate) coupled to package balls 302 through back-end-of-line (BEOL) layers 370. The BEOL layers 370 include multiple BEOL metallization layers (M1, M2, M3, . . . , Mn) on the semiconductor substrate 360 (e.g., a diced silicon wafer). An interconnect layer 312 is coupled to the package balls 302.

The IPD filter die 320 includes a substrate 330 (e.g., a passive substrate) coupled to the package balls 302 through back-end-of-line (BEOL) layers 340 and redistribution layers (RDL) 342. The interconnect layer 312 is coupled to the IPD filter die 320 through the package balls 302. In some aspects of the present disclosure, the substrate 330 is composed of glass, and the IPD filter die 320 is a glass-substrate integrated passive device (GIPD) filter die. In practice, the RFFE module 300 integrates the IPD filter die 320, the semiconductor die 350, and surface-mount technology (SMT) devices on the package substrate 310 (e.g., laminate). The IPD filter die 320, the semiconductor die 350, and the SMT devices (not shown) are arranged in a side-by-side package configuration supported by a package substrate 310. Unfortunately, this side-by-side on package substrate configuration is subjected to decreasing XY size and Z height limitations due to the reduced form factor of future RF applications. That is, the XY size and Z height dimensions of conventional side-by-side on package laminate configurations exceed the form factor of future RFFE module applications. An RFFE implementation that meets reduced XY size and Z height dimensions specified by the form factor of future RFFE module applications is shown, for example, in FIGS. 4A-4C.

Figure 4A:
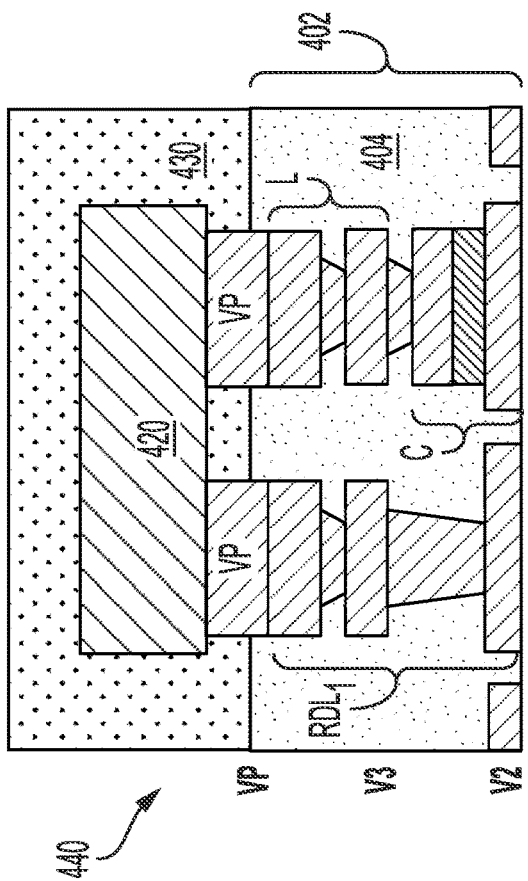
FIGS. 4A-4C are block diagrams illustrating radio frequency front-end (RFFE) modules including wafer-level, double-sided redistribution layer (RDL) substrates for passive and active device integration, according to aspects of the present disclosure.
Figure 4B:
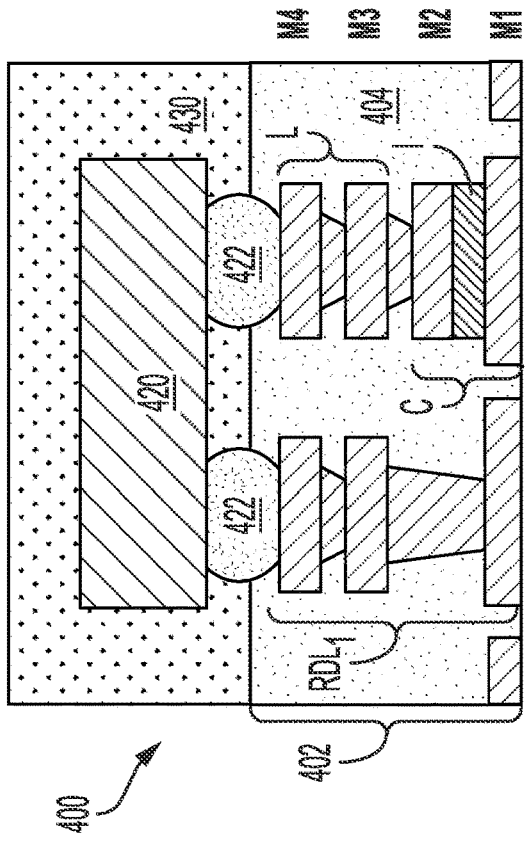
Figure 4C:
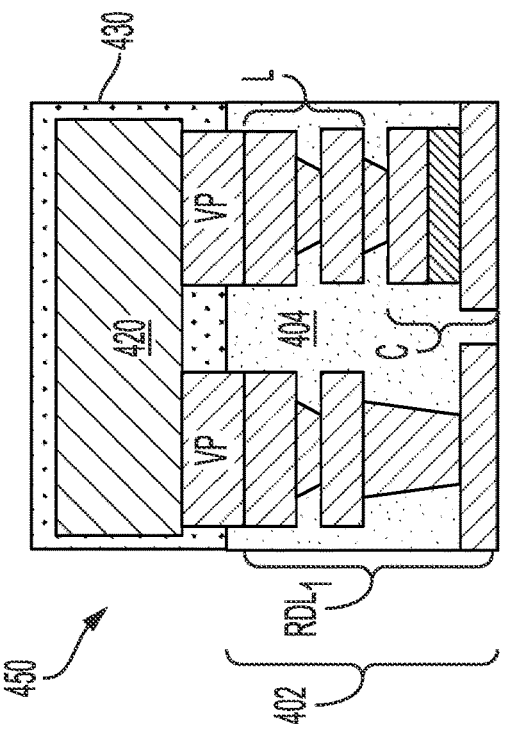

FIGS. 4A-4C are block diagrams illustrating radio frequency front-end (RFFE) modules including wafer-level, double-sided redistribution layer (RDL) substrates for passive and active device integration, according to aspects of the present disclosure. Representatively, an RFFE module 400 includes an RDL substrate composed of interlayer dielectric (ILD) layers 404 composed of, for example, polyimide. In some aspects of the present disclosure, the ILD layers 404 include a metal-insulator-metal (MIM) capacitor C and an inductor L formed from back-end-of-line layers (BEOLs) M1, M2, M3, and M4. The ILD layers 404 also include a first redistribution layer ($RDL_1$) to complete the RDL substrate 402. In this example, the MIM capacitor C is formed using plates of the M1 and M2 metallization layers, below the metallization layer M3 using an insulation layer (I) that is not available during fabrication of organic laminate substrates such as silicon nitride (SiN) or other like dielectric material. The capacitor C and the inductor L provide passive components that may be interconnected to provide an RF filter as well as surface mount technology (SMT) matching passive components of the RFFE module 400.

As shown in FIG. 4A, the RFFE module 400 further includes a first active die 420 coupled to the RDL substrate 402 using flip-chip bonding, according to aspects of the present disclosure. In this example, package balls 422 (e.g., device interconnects) secure the first active die 420 to landing pads of the first $RDL_1$ and the inductor L. In addition, the first active die 420 is encapsulated in a molding compound 430, such as an epoxy molding compound. In some aspects of the present disclosure, the first active die 420 implements an antenna module including active components, such as an RF switch and/or a low noise amplifier.

In some aspects of the present disclosure, the RDL substrate 402 provides a double-sided substrate to enable integration of an RF filter, SMT passive component matching, and laminate routing/inductors. Benefits of the RDL substrate 402 include a significant (e.g., 2×) reduction in the size of the RFFE module 400 in an XY dimension. In addition, the RDL substrate 402 also enables a significant (e.g., 2×) Z height reduction. For example, a four layer (4L) laminate package substrate may have a thickness of 260 microns compared to a 50-micron thickness of the RDL substrate 402. Eliminating the laminate package substrate by using the RDL substrate 402 provides both a cost and size reduction of the RFFE module 400, while providing comparable performance with a side-by-side on laminate package substrate RFFE module configuration.

FIG. 4B is a block diagram illustrating an RFFE module 440, including the RDL substrate 402 for passive and active device integration, according to alternative aspects of the present disclosure. Representatively, the RFFE module 440) includes similar components to the RFFE module 400 of FIG. 4A, which are identified using the same reference numbers. In this alterative configuration, the first active die 420 is coupled to the RDL substrate 402 using through via pads (VP) using a metal-metal direct bonding, or metal-metal or metal-semiconductor eutectic bonding.

FIG. 4C is a block diagram illustrating an RFFE module 450, including the RDL substrate 402 for passive and active device integration, according to alternative aspects of the present disclosure. The RFFE module 450) includes similar components to the RFFE module 440 of FIG. 4B, which are identified using the same reference numbers. In addition, the first active die 420 is coupled to the RDL substrate 402 using through VP with a metal-metal direct bonding, metal-metal or metal-semiconductor eutectic bonding, or other like thermal compression bonding. In these alternative aspects of the present disclosure, a backgrinding process is applied to the molding compound to further reduce a Z height of the RFFE module 450).

Figure 5A:
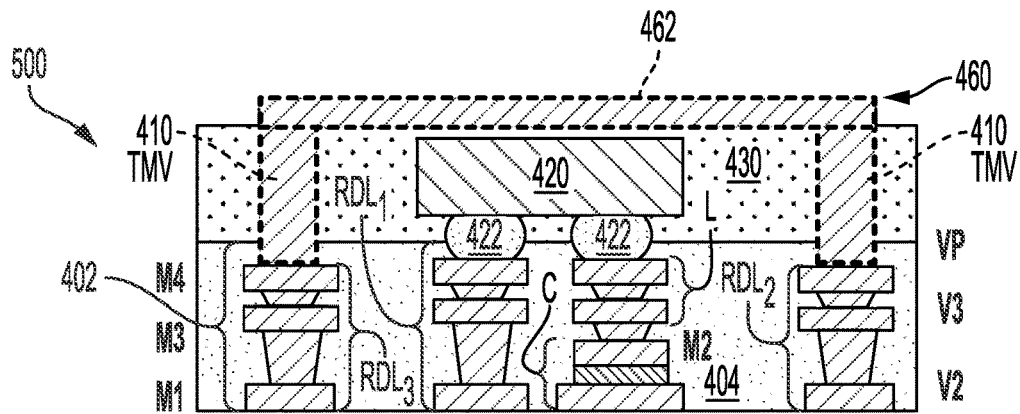
FIGS. 5A-5C are block diagrams further illustrating the radio frequency front-end (RFFE) module of FIG. 4A, according to aspects of the present disclosure.
Figure 5B:
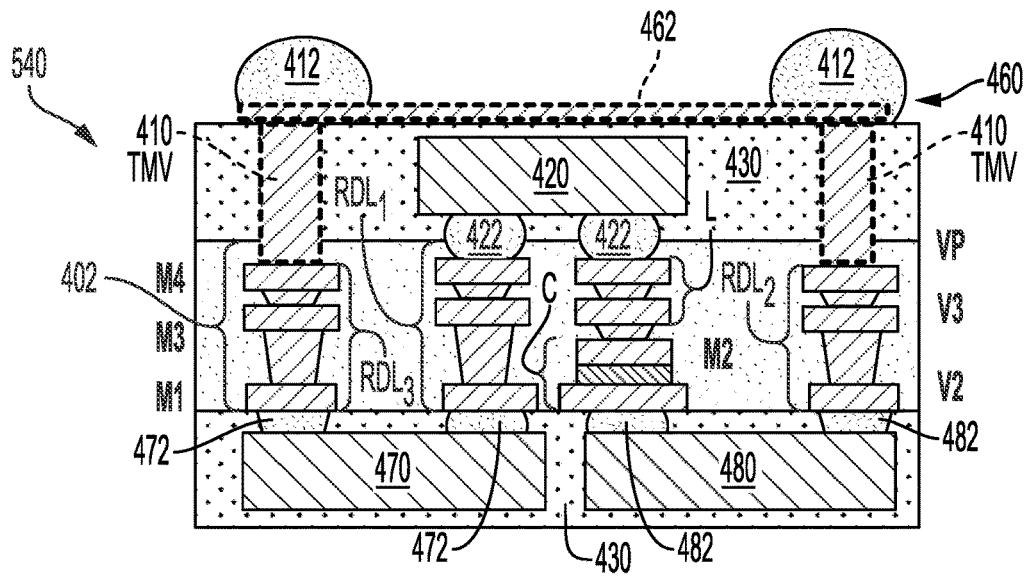
Figure 5C:
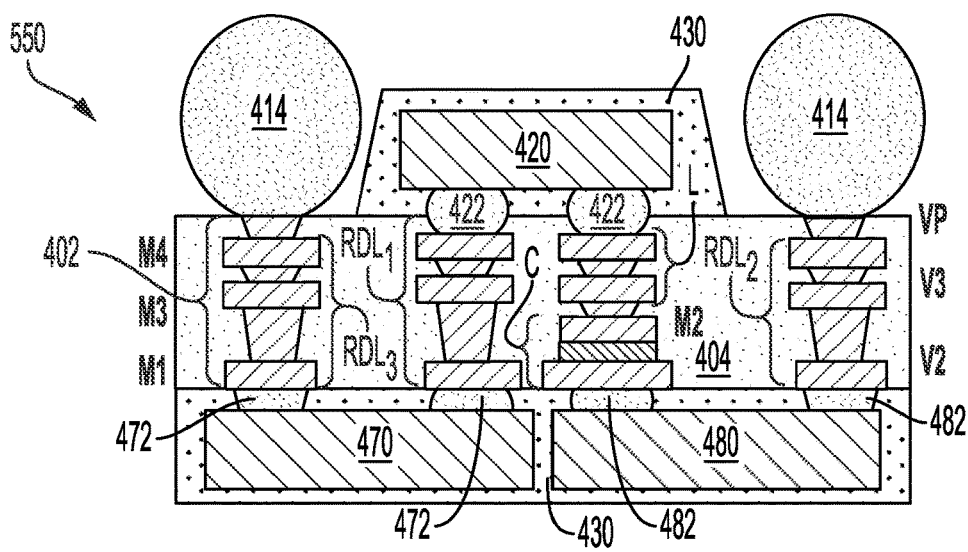

FIGS. 5A-5C are block diagrams further illustrating the RFFE module 400) of FIG. 4A, according to aspects of the present disclosure. As shown in FIG. 5A, an RFFE module 500 is illustrated in which an XY dimension of the RDL substrate 402 is greater than an XY dimension of the first active die 420 to provide additional passive components. This configuration of the RDL substrate 402 is similar to the configuration shown in FIG. 4A, and is described using similar references. In this example, the RDL substrate 402 includes the first $RDL_1$, a second $RDL_2$, and a third $RDL_3$ coupled to a 3D inductor 460. In some aspects of the present disclosure, the 3D inductor 460 is composed of through mold vias (TMVs) 410 coupled to the second $RDL_2$ and the third $RDL_3$, and joined together through a conductive trace 462 on a surface of the molding compound 430). In this example, the package balls 422 also secure the first active die 420 to the landing pads of the first $RDL_1$ and the inductor L.

FIG. 5B illustrates an RFFE module 540) in a multi-active die configuration, according to aspects of the present disclosure. This configuration of the RFFE module 540) is similar to the configuration shown in FIG. 4A, and is described using similar references. In this example, the RDL substrate 402 also includes the second $RDL_2$ and the third $RDL_3$ coupled to the 3D inductor 460. The 3D inductor 460 is also composed of the TMVs 410 (e.g., a first TMV and a second TMV) coupled to the second $RDL_2$ and the third $RDL_3$, and joined together through the conductive trace 462 on the surface of the molding compound 430). In some aspects of the present disclosure, a ball grid array (BGA) 412 is coupled to the conductive trace 462. In addition, the package balls 422 also secure the first active die 420 to the landing pads of the first $RDL_1$ and the inductor L.

In some aspects of the present disclosure, the antenna module functionality of the first active die 420 of FIG. 4A is separated to provide a second active die 470) and a third active die 480. The first active die 420, the second active die 470) and the third active die 480 may be implemented as a silicon (Si) or a III-V material active die. Alternatively, one of these active dies is implemented as a passive die or an acoustic die, although this configuration is less likely due to hermetic sealing specifications for acoustic/micro-electro-mechanical system (MEMS) devices. In addition, active die to passive component connection may be performed using flip-chip bonding or copper-to-copper (Cu—Cu) bonding (not shown). In some aspects of the present disclosure, the first active die 420 provides an RF switch die, the second active die 470 provides a low noise amplifier (LNA) die, and the third active die 480 is implemented as a gallium arsenide (GaAs) die. In this example, package balls 472 secure the second active die 470 to the landing pads of the first RDL; and the second $RDL_2$. In addition, package balls 482 also secure the third active die 480 to landing pads of the second $RDL_1$ and the inductor L. The molding compound 430 encapsulates the second active die 470 and the third active die 480.

FIG. 5C illustrates an RFFE module 550 in a multi-active die configuration, according to aspects of the present disclosure. This configuration of the RFFE module 550 is similar to the configuration shown in FIG. 5B, and is described using similar references. In this example, the RDL substrate 402 includes the second RDL$_2$ and the third RDL$_3$, but does not include the 3D inductor 460 or the TMVs 410. Instead, package balls 414 are secured to via pads of the second RDL$_2$ and the third RDL$_3$. The RFFE module 550 also includes the second active die 470 and the third active die 480, which may be similarly configured as shown in FIG. 5B.

Figure 6B:
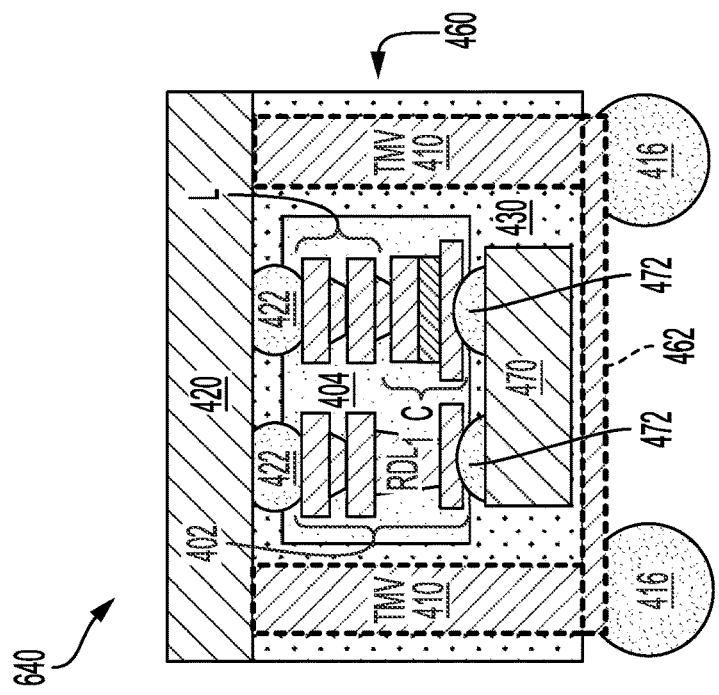
FIGS. 6A and 6B are block diagrams further illustrating the radio frequency front-end (RFFE) module of FIG. 4A, according to aspects of the present disclosure.
Figure 6A:
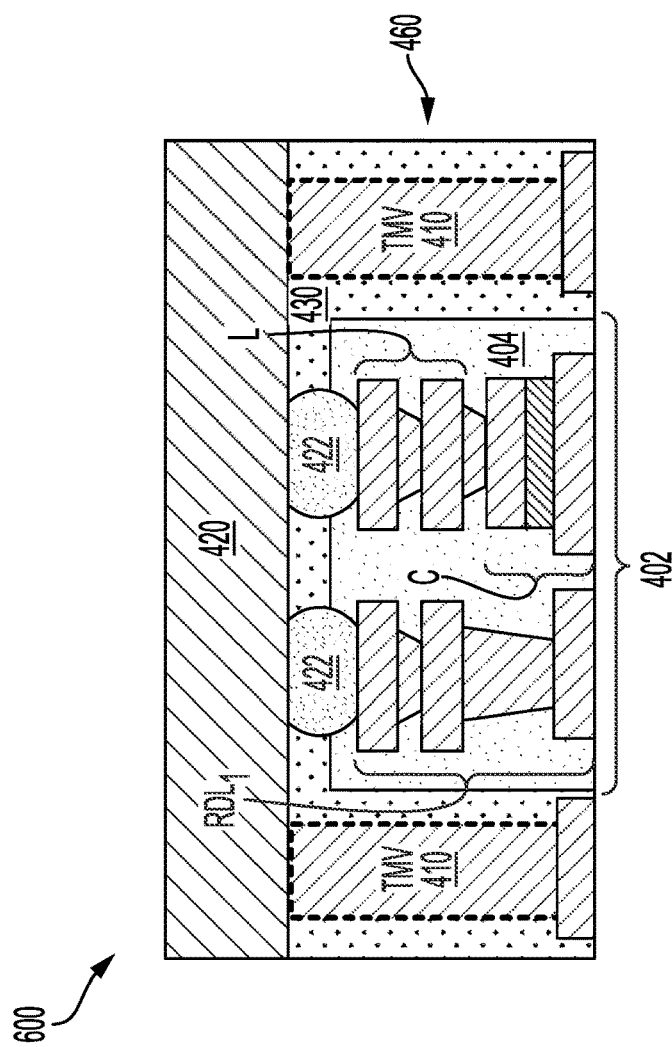

FIGS. 6A and 6B are block diagrams further illustrating the RFFE module 400 of FIG. 4A, according to aspects of the present disclosure. As shown in FIG. 6A, an RFFE module 600 is illustrated in which an XY dimension of the RDL substrate 402 is less than an XY dimension of the first active die 420 to provide additional active components. This configuration of the RDL substrate 402 is similar to the configuration shown in FIG. 4A, and is described using similar references. In this example, the RDL substrate 402 includes the first active die 420 coupled to the 3D inductor 460. In some aspects of the present disclosure, the 3D inductor 460 is composed of the TMVs 410 coupled to the first active die 420. In this example, the package balls 422 also secure the first active die 420 to the landing pads of the first RDL$_1$ and the inductor L.

FIG. 6B illustrates an RFFE module 640 in a multi-active die configuration, according to aspects of the present disclosure. This configuration of the RFFE module 640 is similar to the configuration shown in FIG. 4A, and is described using similar references. In this example, the RDL substrate 402 also includes the first active die 420 coupled to the 3D inductor 460 through the TMVs 410. The 3D inductor 460 is composed of the TMVs 410 coupled to the first active die 420 and joined together through the conductive trace 462 on the surface of the molding compound 430. In some aspects of the present disclosure, a ball grid array (BGA) 416 is coupled to the conductive trace 462. In addition, package balls 472 secure the second active die 470 to the landing pads of the first RDL$_1$ and the inductor L.

Figure 7A:
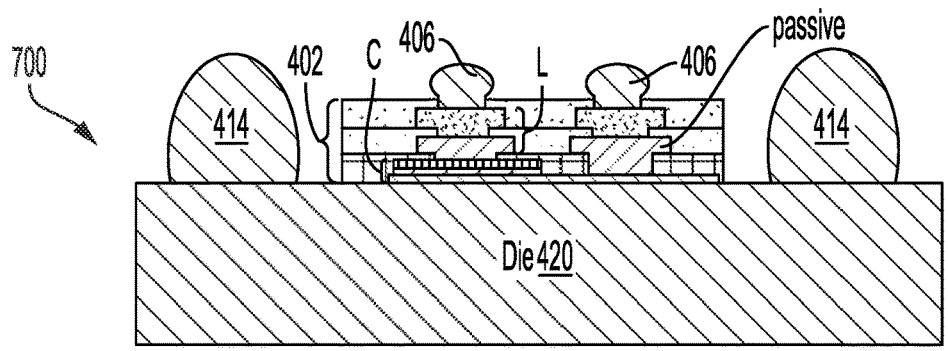
FIGS. 7A-7D are block diagrams illustrating various options to assemble a redistribution layer (RDL) substrate and an active die to form radio frequency front-end (RFFE) modules, according to aspects of the present disclosure.

FIGS. 7A-7D are block diagrams illustrating various options to assemble the RDL substrate 402 and the first active die 420 to form RFFE modules, according to aspects of the present disclosure. As shown in FIG. 7A, an RFFE module 700 is illustrated in which a face of the RDL substrate 402 is secured to a face of the first active die 420, according to a face-to-face configuration. This configuration of the RDL substrate 402 is similar to the configuration shown in FIG. 4A, and is described using similar references. In this example, a capacitor C side of the RDL substrate 402 is the face of the RDL substrate 402. A backside of the RDL substrate 402 includes micro-bumps 406, and the face of the first active die 420 includes the package balls 414.

Figure 7B:
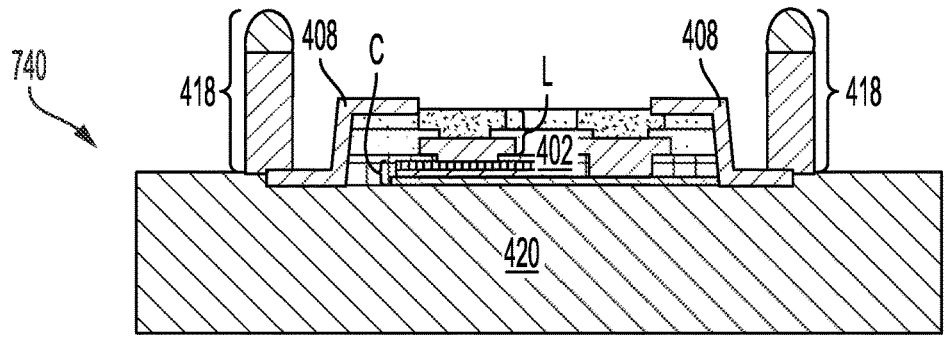

In FIG. 7B, an RFFE module 740 is illustrated in which the face of the RDL substrate 402 is secured to the face of the first active die 420, according to a face-to-face configuration. This configuration of the RDL substrate 402 is similar to the configuration shown in FIG. 4A, and is described using similar references. As noted, the capacitor C side of the RDL substrate 402 is the face of the RDL substrate 402. In some aspects of the present disclosure, the backside of the RDL substrate 402 includes sidewall wall interconnects 408 coupled to the face of the first active die 420, which includes conductive pillars 418, rather than the package balls 414 shown in FIG. 7A.

Figure 7C:
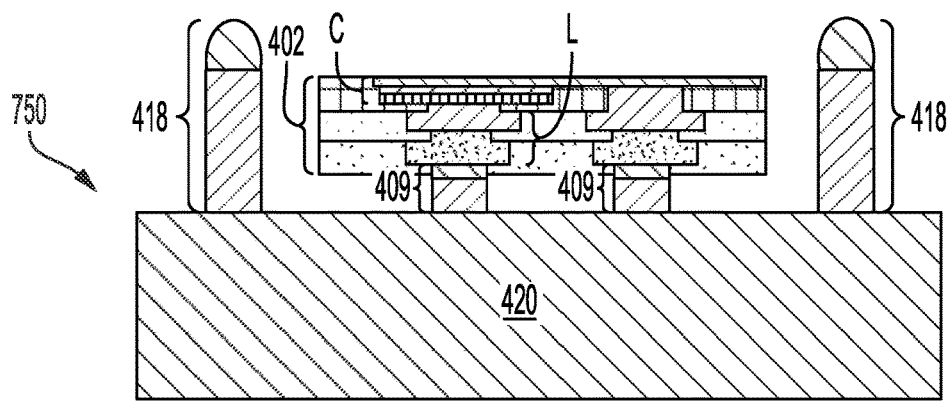

In FIG. 7C, an RFFE module 750 is illustrated in which a backside of the RDL substrate 402 is secured to the face of the first active die 420, according to a back-to-face configuration. This configuration of the RDL substrate 402 is similar to the configuration shown in FIG. 4A, and is described using similar references. In this example, the inductor L side of the RDL substrate 402 is the backside of the RDL substrate 402. In some aspects of the present disclosure, the backside of the RDL substrate 402 includes micro-pillar interconnects 409 coupled to the face of the first active die 420, which includes conductive pillars 418, rather than the package balls 414 shown in FIG. 7A.

Figure 7D:
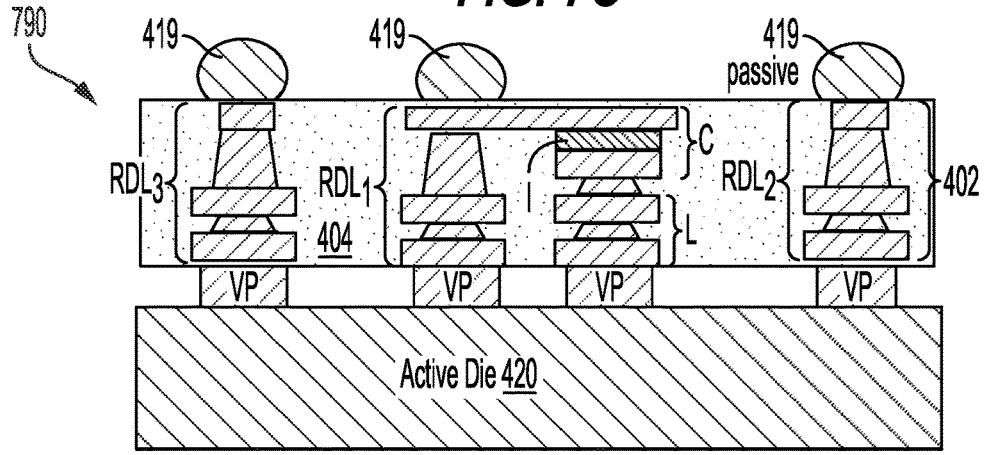

In FIG. 7D, an RFFE module 790 is illustrated in which a backside of the RDL substrate 402 is secured to the face of the first active die 420, according to a back-to-face configuration. This configuration of the RDL substrate 402 is similar to the configuration shown in FIGS. 4B and 4C, and is described using similar references. As noted, the inductor L side of the RDL substrate 402 is the backside of the RDL substrate 402. In some aspects of the present disclosure, the backside of the RDL substrate 402 includes through via pads (VP) coupled to the face of the first active die 420. In this alternative configuration, the first active die 420 is coupled to the RDL substrate 402 using through VP with a metal-metal direct bonding, or metal-metal or metal-semiconductor eutectic bonding. In addition, the face of the RDL substrate 402, which includes package balls 419, may be part of a land grid array (LGA), a ball grid array (BGA), or other like interconnect structure.

Figure 8A:
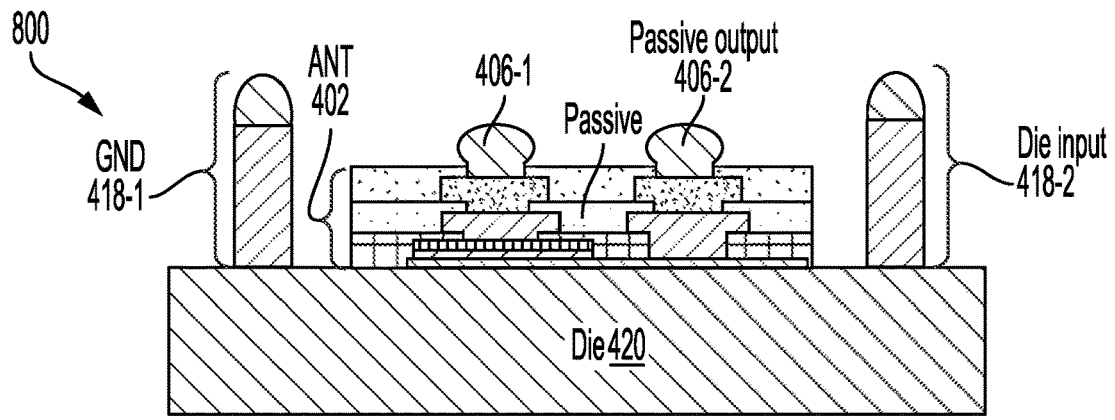
FIGS. 8A-8C are block diagrams illustrating an assembly process to form a radio frequency front-end (RFFE) module that is secured to a mobile motherboard, according to aspects of the present disclosure.
Figure 8B:
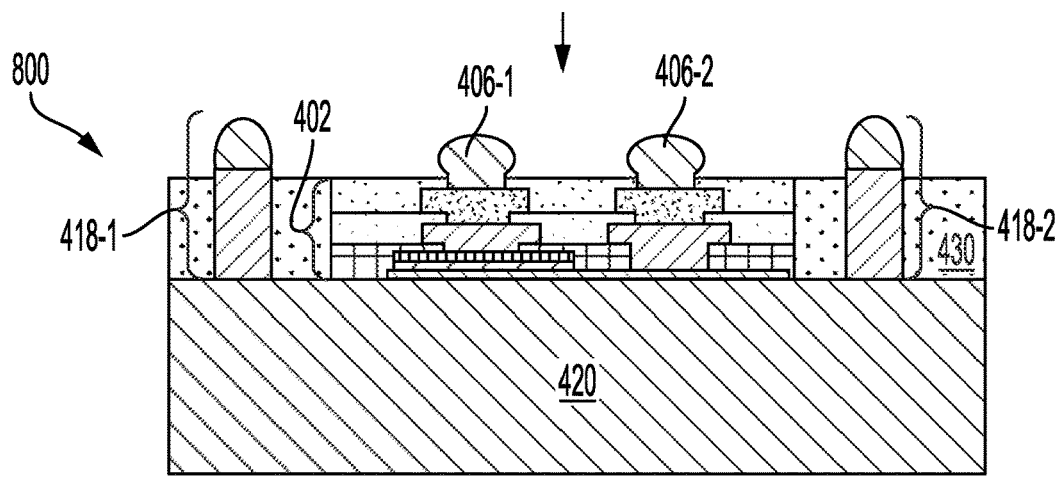
Figure 8C:
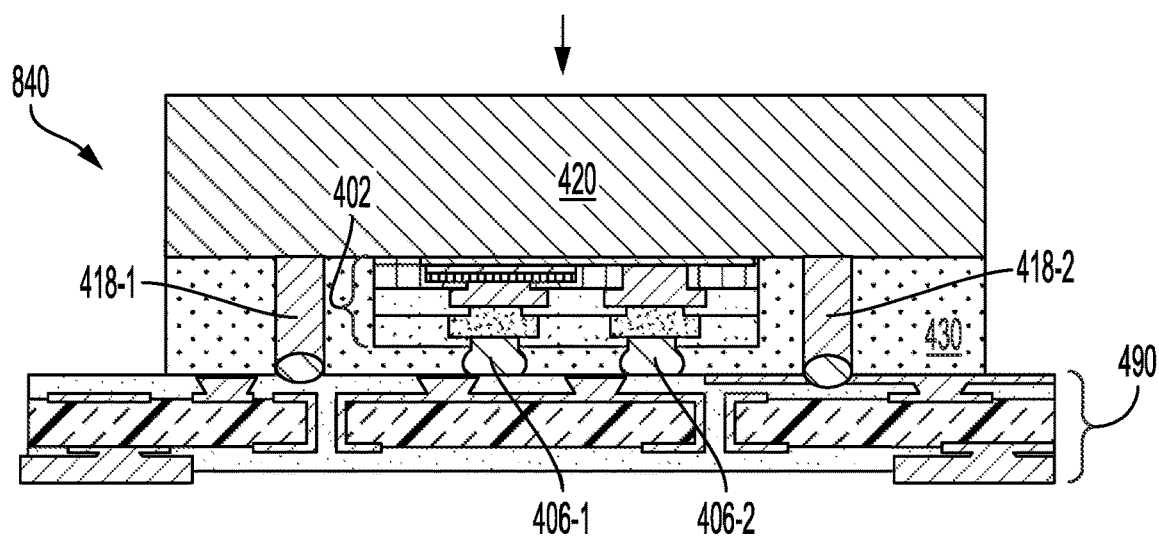

FIGS. 8A-8C are block diagrams illustrating an assembly process to form a radio frequency front-end (RFFE) module that is secured to a mobile motherboard, according to aspects of the present disclosure. As shown in FIG. 8A, an RFFE module 800 is illustrated in which the face of the RDL substrate 402 is secured to the face of the first active die 420, according to a face-to-face configuration. This configuration of the RFFE module 800 is similar to the configuration shown in FIG. 7A, and is described using similar references. In this example, the face of the first active die 420 includes the conductive pillars 418, rather than the package balls 414, shown in FIG. 7A. In some aspects of the present disclosure, a first conductive pillar 418-1 provides a ground (GND) and a second conductive pillar 418-2 provides an input to the first active die 420. In addition, a first micro-bump 406-1 provides an antenna (ANT) and a second micro-bump 406-2 provides a passive output of the RFFE module 800.

As shown in FIG. 8B, a molding compound is deposited on the face of the first active die 420, according to a fan-out wafer level package (FOWLP) configuration, according to aspects of the present disclosure. As shown in FIG. 8C, an over-mold process is performed (e.g., on an LGA/BGA/lead frame) to secure the RFFE module 800 to a printed circuit board (PCB) 490. In some aspects of the present disclosure, the RFFE module 800 is secured to a motherboard to complete assembly of an RFFE module package 840.

Figure 9A:
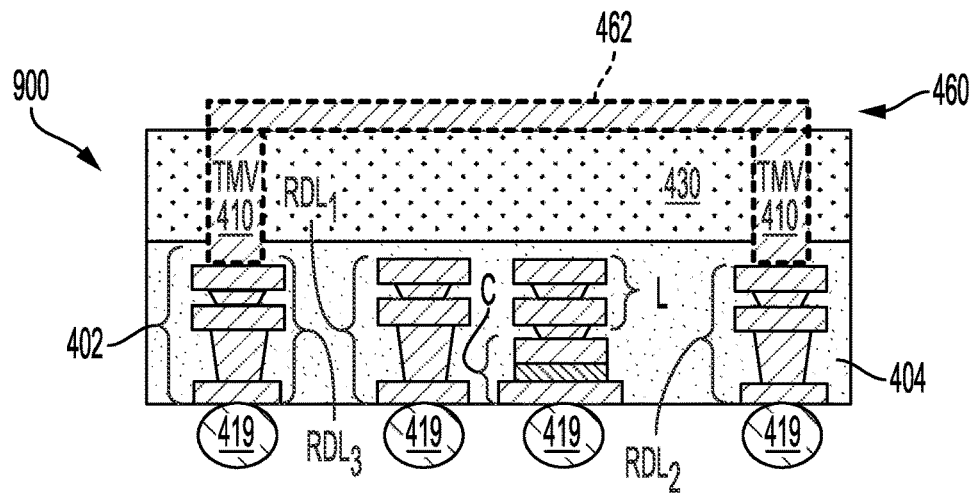
FIGS. 9A-9C are block diagrams illustrating a radio frequency (RF) filter including a redistribution layer (RDL) substrate, according to aspects of the present disclosure.
Figure 9B:
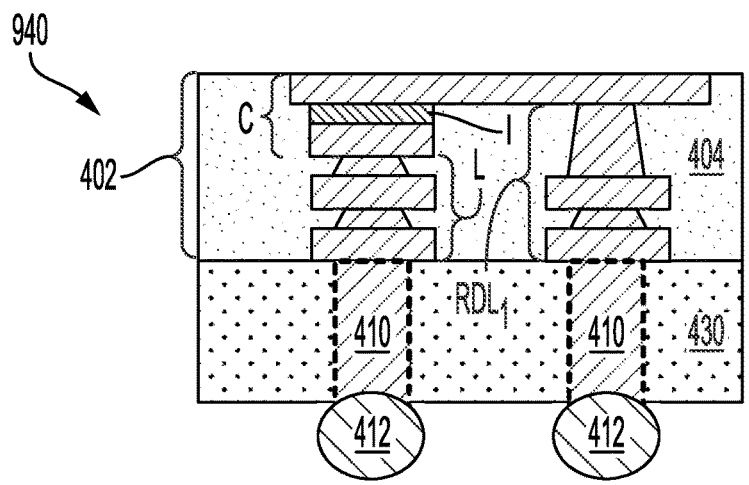
Figure 9C:
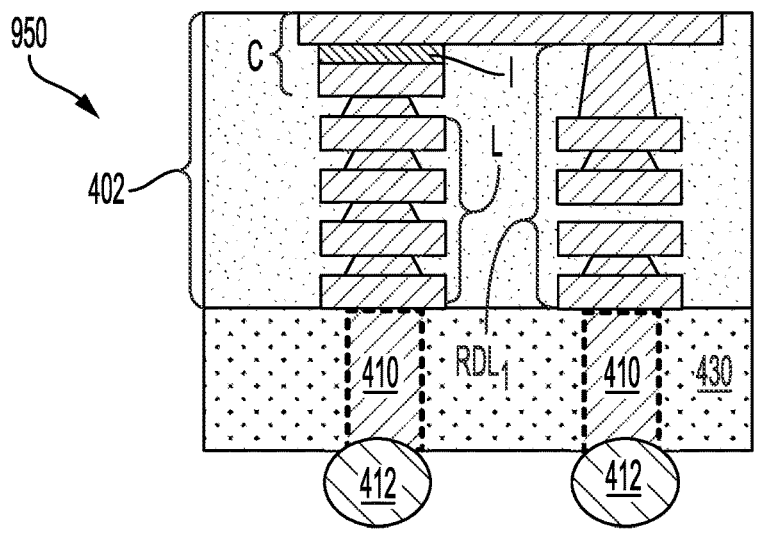

FIGS. 9A-9C are block diagrams illustrating a radio frequency (RF) filter including a redistribution layer (RDL) substrate, according to aspects of the present disclosure. As shown in FIG. 9A, an RF filter module 900 is illustrated according to a similar configuration to the RFFE module 500 shown in FIG. 5A. This configuration of the RF filter module 900 is similar to the configuration shown in FIG. 7A, and is described using similar reference numbers. In this example, the first active die 420 is omitted from the RF filter module 900.

As shown in FIG. 9B, an RF filter module 940 is illustrated, according to a similar configuration to the RFFE module 400 shown in FIG. 4A. This configuration of the RF filter module 940 is similar to the configuration shown in FIG. 7A, and is described using similar reference numbers. In some aspects of the present disclosure, the through mold vias (TMVs) 410 secure a ball grid array (BGA) 412 to the inductor L and the first RDL$_1$. In this example, the first active die 420 is also omitted from the RF filter module 940.

As shown in FIG. 9C, an RF filter module 950 is illustrated, according to a similar configuration to the RF filter module 940 shown in FIG. 9B. This configuration of the RF filter module 950 is similar to the configuration shown in FIG. 9B, and is described using similar reference numbers. In some aspects of the present disclosure, the TMVs 410 also secure the BGA 412 to the inductor L and the first RDL$_1$. In this example, the RF filter module 950 is shown according to a six layer configuration, versus the four layer configuration of the RF filter module 940 shown in FIG. 9B. In operation, the six layer configuration of the RF filter module 950 may improve RF performance relative to the four layer configuration of the RF filter module 940 shown in FIG. 9B. In addition, the first active die 420 is also omitted from the RF filter module 950. A process for fabrication of an RFFE module including an RDL substrate is shown, for example, in FIGS. 10A-10C.

Figure 10A:
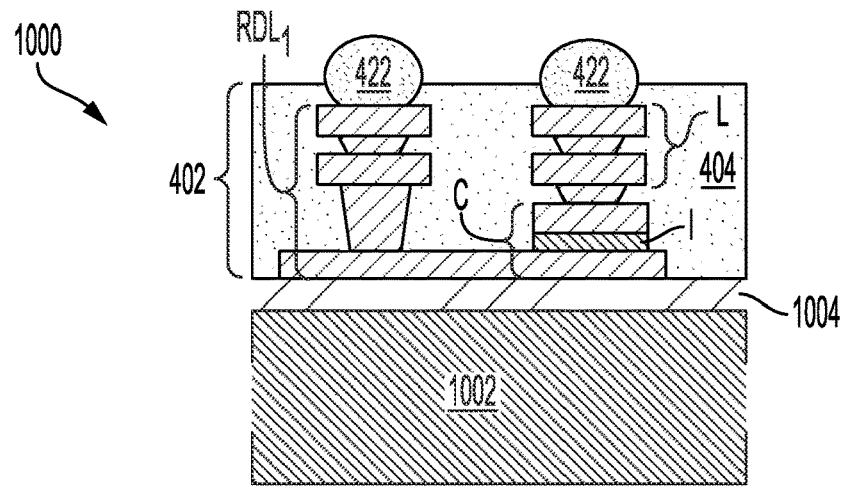
FIGS. 10A-10C are block diagrams illustrating a process of fabricating a radio frequency front-end (RFFE) module including a redistribution layer (RDL) substrate, according to aspects of the present disclosure.
Figure 10B:
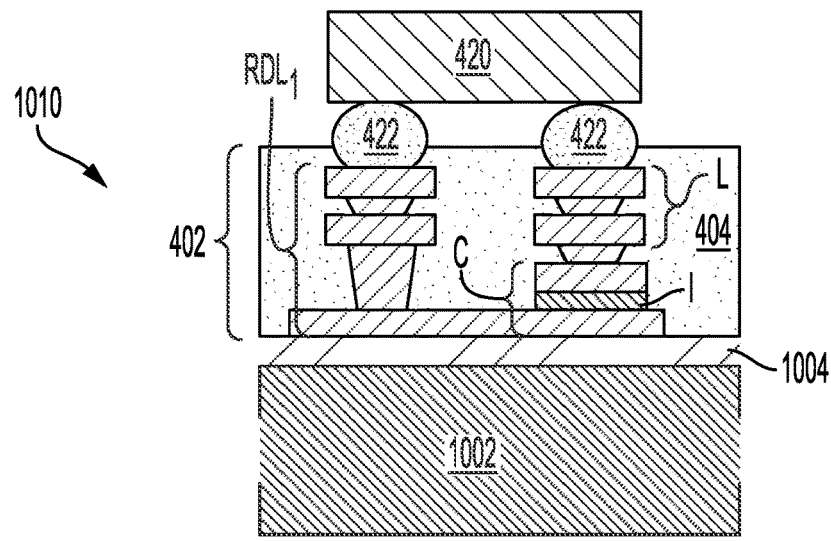
Figure 10C:
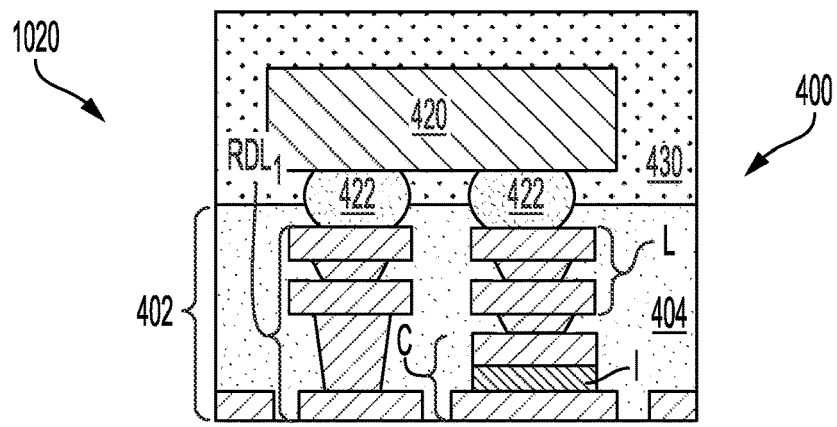

FIGS. 10A-10C are block diagrams illustrating a process of fabricating an RFFE module including an RDL substrate, according to aspects of the present disclosure. As shown in FIG. 10A, at step 1000, an RDL substrate 402 including at least one passive component (e.g., C and/or L) in interlayer dielectric (ILD) layers 404 of the RDL substrate 402 is formed on a carrier glass substrate 1002. In some aspects of the present disclosure, the carrier glass substrate 1002 is temporarily secured to the RDL substrate 402 with an adhesive layer 1004.

As shown in FIG. 10B, at step 1010, the first active die 420 is coupled to a second surface of the RDL substrate 402, opposite a first surface of the RDL substrate 402 proximate the carrier glass substrate 1002. As shown in FIG. 10C, at step 1020, the carrier glass substrate 1002 is removed from the first surface of the RDL substrate 402 and the molding compound 430 is formed on the first active die 420 to complete formation of the RFFE module 400, for example, as shown in FIG. 4A. In some aspects of the present disclosure, the carrier glass substrate 1002 is removed from the RDL substrate 402 by exposing and illuminating the adhesive layer 1004 through the carrier glass substrate 1002.

Figure 11:
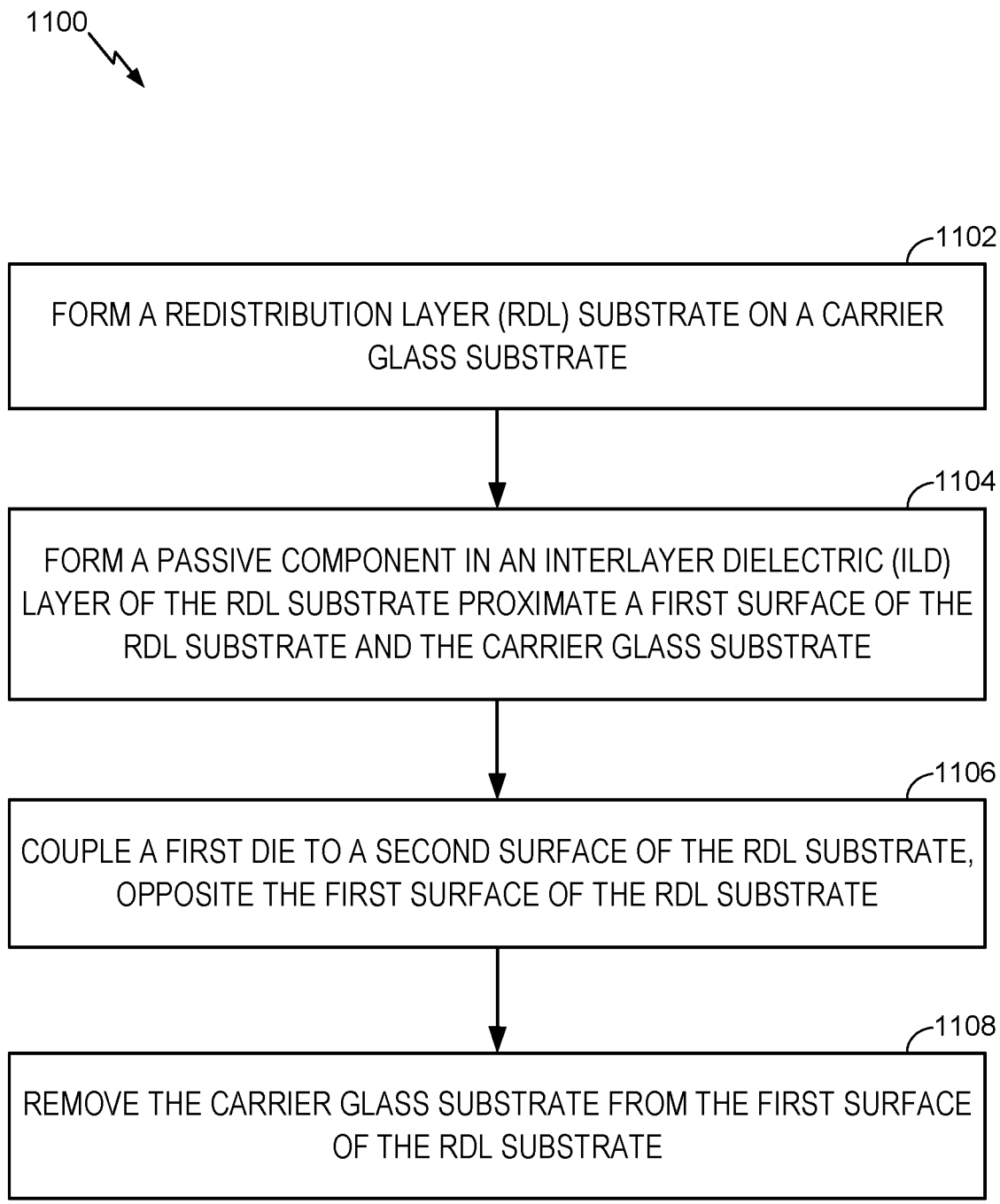
FIG. 11 is a process flow diagram illustrating a method for fabricating a radio frequency front-end (RFFE) module including a redistribution layer (RDL) substrate, according to aspects of the present disclosure.

FIG. 11 is a process flow diagram illustrating a method for fabricating a radio frequency front-end (RFFE) module including a redistribution layer (RDL) substrate, according to aspects of the present disclosure. A method 1100 begins in block 1102, in which a redistribution layer (RDL) substrate is formed on a carrier glass substrate. For example, as shown in FIG. 10A, at step 1000, the RDL substrate 402 is formed on a carrier glass substrate 1002. In this example, the carrier glass substrate 1002 is temporarily secured to the RDL substrate 402 using an adhesive layer 1004. That is, the carrier glass substrate 1002 provides a wafer supporting system (WSS).

In block 1104, a passive component is formed in an interlayer dielectric (ILD) layer of the RDL substrate proximate a first surface of the RDL substrate and the carrier glass substrate. As shown in FIG. 4A, the RDL substrate 402 is composed of interlayer dielectric (ILD) layers 404 composed of, for example, polyimide. In some aspects of the present disclosure, the ILD layers 404 include a metal-insulator-metal (MIM) capacitor C and an inductor L formed from back-end-of-line layers (BEOLs) M1, M2, M3, and M4. The ILD layers 404 also include a first redistribution layer (RDL$_1$) to complete the RDL substrate 402. In this example, the MIM capacitor C is formed using plates of the M1 and M2 metallization layers, below the metallization layer M3 using an insulation layer (I) that is not available during fabrication of organic laminate substrates such as silicon nitride (SiN) or other like dielectric material. The capacitor C and the inductor L provide passive components that may be interconnected to provide an RF filter as well as surface mount technology (SMT) matching passive devices of the RFFE module 400.

Referring again to FIG. 11, at block 1106, a first die is coupled to a second surface of the RDL substrate, opposite the first surface of the RDL substrate. For example, as shown in FIG. 4A, the RFFE module 400 further includes a first active die 420 coupled to the RDL substrate 402 using flip-chip bonding, according to aspects of the present disclosure. In this example, package balls 422 secure the first active die 420 to landing pads of the first RDL$_1$ and the inductor L. As shown in FIG. 10B, at step 1010, the first active die 420 is coupled to a second surface of the RDL substrate 402, opposite a first surface of the RDL substrate 402 proximate the carrier glass substrate 1002.

At block 1108, the carrier glass substrate is removed from the first surface of the RDL substrate. For example, as shown in FIG. 10C, at step 1020, the carrier glass substrate 1002 is removed from the first surface of the RDL substrate 402 and the molding compound 430 is formed on the first active die 420 to complete formation of the RFFE module 400, for example, as shown in FIG. 4A. In some aspects of the present disclosure, the carrier glass substrate 1002 is removed from the RDL substrate by exposing and illuminating the adhesive layer 1004 through the carrier glass substrate 1002.

In some aspects of the present disclosure, an RDL substrate provides a double-sided substrate to enable integration of an RF filter, SMT passive component matching, and laminate routing/inductors. Benefits of the RDL substrate include a significant (e.g., 2×) reduction in the size of an RFFE module in an XY dimension. In addition, the RDL substrate also enables a significant (e.g., 2×) Z height reduction. For example, a four layer (4L) laminate package substrate may have a thickness of 260 microns compared to a 50-micron thickness of the RDL substrate. Eliminating the laminate package substrate by using the RDL substrate provides both a cost and a size reduction of the RFFE module, while providing comparable performance with a side-by-side on laminate package substrate RFFE module.

According to a further aspect of the present disclosure, a device includes a redistribution layer (RDL) substrate and a first die coupled to a second surface of the RDL substrate, opposite a first surface of the RDL substrate. In one configuration, the device has means for means for storing charge proximate the first surface of the RDL substrate. In one configuration, the charge storing means may be the MIM capacitor C, as shown in FIG. 4. In another aspect, the aforementioned means may be any structure or any material configured to perform the functions recited by the aforementioned means.

Figure 12:
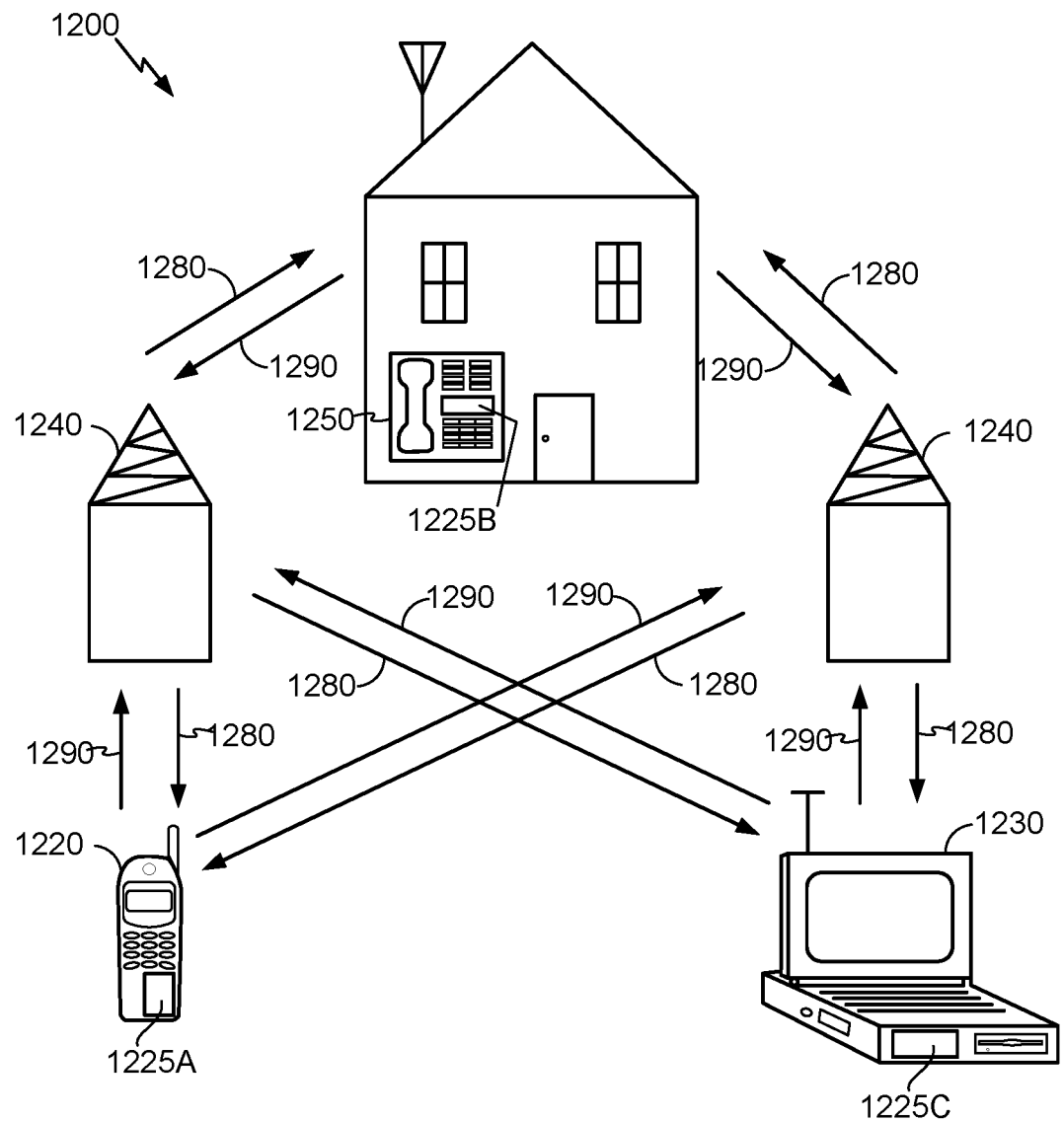
FIG. 12 is a block diagram showing an exemplary wireless communications system in which a configuration of the present disclosure may be advantageously employed.

FIG. 12 is a block diagram showing an exemplary wireless communications system 1200 in which an aspect of the disclosure may be advantageously employed. For purposes of illustration, FIG. 12 shows three remote units 1220, 1230, and 1250 and two base stations 1240. It will be recognized that wireless communications systems may have many more remote units and base stations. Remote units 1220, 1230, and 1250 include integrated circuit (IC) devices 1225A, 1225C, and 1225B that include the disclosed RDL substrate. It will be recognized that other devices may also include the disclosed RDL substrate, such as the base stations, switching devices, and network equipment. FIG. 12 shows forward link signals 1280 from the base station 1240 to the remote units 1220, 1230, and 1250, and reverse link signals 1290 from the remote units 1220, 1230, and 1250 to base stations 1240.

In FIG. 12, remote unit 1220 is shown as a mobile telephone, remote unit 1230 is shown as a portable computer, and remote unit 1250 is shown as a fixed location remote unit in a wireless local loop system. For example, the remote units may be a mobile phone, a hand-held personal communication systems (PCS) unit, a portable data unit, such as a personal data assistant, a GPS enabled device, a navigation device, a set top box, a music player, a video player, an entertainment unit, a fixed location data unit, such as meter reading equipment, or other device that stores or retrieves data or computer instructions, or combinations thereof. Although FIG. 12 illustrates remote units according to the aspects of the present disclosure, the present disclosure is not limited to these exemplary illustrated units. Aspects of the present disclosure may be suitably employed in many devices, which include the disclosed RDL substrate.

Figure 13:
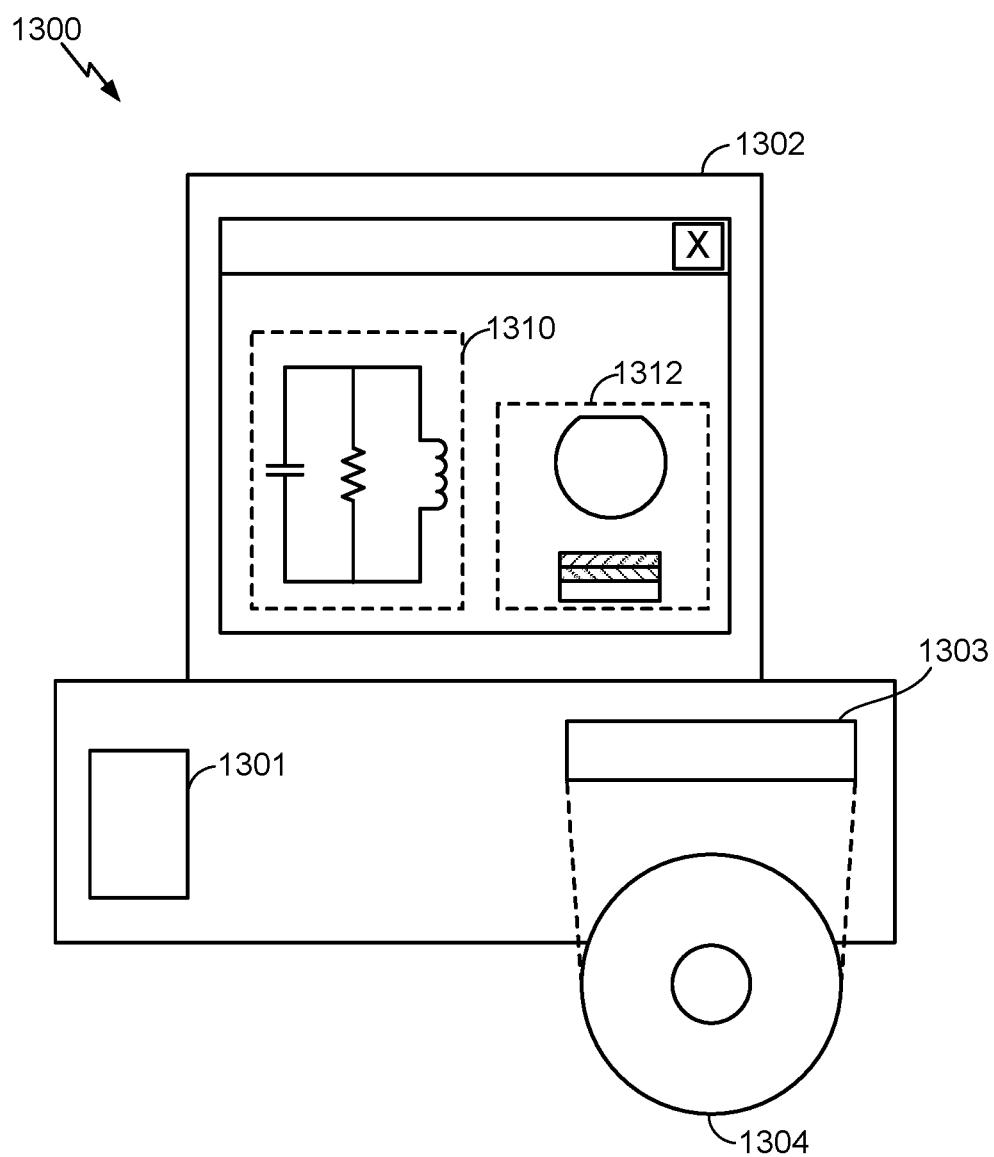
FIG. 13 is a block diagram illustrating a design workstation used for circuit, layout, and logic design of a semiconductor component according to one configuration.

FIG. 13 is a block diagram illustrating a design workstation used for circuit, layout, and logic design of a semiconductor component, such as the RDL substrate disclosed above. A design workstation 1300 includes a hard disk 1301 containing operating system software, support files, and design software such as Cadence or OrCAD. The design workstation 1300 also includes a display 1302 to facilitate design of a circuit 1310 or a radio frequency (RF) component 1312 such as an RDL substrate. A storage medium 1304 is provided for tangibly storing the design of the circuit 1310 or the RF component 1312 (e.g., the RDL substrate). The design of the circuit 1310 or the RF component 1312 may be stored on the storage medium 1304 in a file format such as GDSII or GERBER. The storage medium 1304 may be a compact disc read-only memory (CD-ROM), digital versatile disc (DVD), hard disk, flash memory, or other appropriate device. Furthermore, the design workstation 1300 includes a drive apparatus 1303 for accepting input from or writing output to the storage medium 1304.

Data recorded on the storage medium 1304 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1304 facilitates the design of the circuit 1310 or the RF component 1312 by decreasing the number of processes for designing semiconductor wafers.

Implementation examples are described in the following numbered clauses:

1. A device, comprising:
   a redistribution layer (RDL) substrate;
   a passive component in the RDL substrate proximate a first surface of the RDL substrate; and
   a first die coupled to a second surface of the RDL substrate, opposite the first surface of the RDL substrate.

2. The device of clause 1, further comprising device interconnects coupled between the first die and the second surface of the RDL substrate.

3. The device of any of clauses 1 or 2, further comprising a second die coupled to the passive component, opposite the first die.

4. The device of clause 3, further comprising a third die coupled to the passive component, opposite the first die and proximate the second die.

5. The device of any of clauses 1-4, further comprising:
   a molding compound on the second surface of the RDL substrate and the first die;
   a first RDL in the RDL substrate;
   a second RDL in the RDL substrate;
   a first through mold via (TMV) coupled to the first RDL;
   a second TMV coupled to the second RDL; and
   a 3D inductor comprising a trace on a surface of the molding compound and coupled to the first TMV and the second TMV.

6. The device of any of clauses 1-5, in which the first die comprises an antenna module.

7 The device of any of clauses 1-6, in which the passive component comprises a metal-insulator-metal (MIM) capacitor.

8 The device of clause 7, further comprising an inductor coupled to the MIM capacitor.

9. The device of any of clauses 1-8, in which the device comprises a radio frequency (RF) filter.

10. The device of any of clauses 1-9, in which the device comprises a radio frequency front-end (RFFE) module.

11. A method for fabricating a device, comprising:
   forming a redistribution layer (RDL) substrate on a carrier glass substrate;
   forming a passive component in an interlayer dielectric (ILD) layer of the RDL substrate proximate a first surface of the RDL substrate and the carrier glass substrate;
   coupling a first die to a second surface of the RDL substrate, opposite the first surface of the RDL substrate; and
   removing the carrier glass substrate from the first surface of the RDL substrate.

12. The method of clause 11, further comprising forming device interconnects on the second surface of the RDL substrate to couple the first die to the second surface of the RDL substrate.

13. The method of any of clauses 11 or 12, further comprising coupling a second die to the passive component, opposite the first die.

14. The method of clause 13, further comprising coupling a third die to the passive component, opposite the first die and proximate the second die.

15. The method of any of clauses 11-14, further comprising:
   depositing a molding compound on the second surface of the RDL substrate and the first die;
   forming a first RDL in the RDL substrate;
   forming a second RDL in the RDL substrate;
   forming a first through mold via (TMV) coupled to the first RDL;
   forming a second TMV coupled to the second RDL; and
   forming a 3D inductor by depositing a trace on a surface of the molding compound and coupled to the first TMV and the second TMV.

16. The method of any of clauses 11-15, in which the first die comprises an antenna module.

17. The method of any of clauses 11-16, in which the passive component comprises a metal-insulator-metal (MIM) capacitor.

18. The method of clause 17, further comprising forming an inductor coupled to the MIM capacitor.

19. The method of clause 18, further comprising integrating the device in a radio frequency (RF) filter.

20. The method of any of clauses 11-19, further comprising integrating the device in a radio frequency front-end (RFFE) module.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include random access memory (RAM), read-only memory (ROM), electrically erasable programmable read-only memory (EEPROM), compact disc read-only memory (CD-ROM) or other optical disk storage, magnetic disk storage or other magnetic storage devices, or other medium that can be used to store desired program code in the form of instructions or data structures and that can be accessed by a computer. Disk and disc, as used herein, include compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function, or achieve substantially the same result as the corresponding configurations described herein, may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in random access memory (RAM), flash memory, read-only memory (ROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general-purpose or special-purpose computer. By way of example, and not limitation, such computer-readable media can include random access memory (RAM), read-only memory (ROM), electrically erasable programmable read-only memory (EEPROM), compact disc read-only memory (CD-ROM) or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. In addition, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray disc, where disks usually reproduce data magnetically, while discs reproduce data optically with lasers. Combinations of the above should also be included within the scope of computer-readable media.

The previous description of the present disclosure is provided to enable any person skilled in the art to make or use the disclosure. Various modifications to the present disclosure will be readily apparent to those skilled in the art, and the generic principles defined herein may be applied to other variations without departing from the spirit or scope of the disclosure. Thus, the present disclosure is not intended to be limited to the examples and designs described herein but is to be accorded the widest scope consistent with the principles and novel features disclosed herein.

What is claimed is:

1. A device, comprising:
   a redistribution layer (RDL) substrate;
   a first passive component in the RDL substrate proximate a first surface of the RDL substrate;
   a second passive component in the RDL substrate proximate a second surface of the RDL substrate and coupled in series with the first passive component;
   a first die coupled to the second surface of the RDL substrate, opposite the first surface of the RDL substrate and coupled to the first passive component and the second passive component via a first device interconnect coupled between the first die and the second surface of the RDL substrate;
   a second die coupled to the first surface of the RDL substrate and coupled to the first passive component and the second passive component; and
   a first RDL in the RDL substrate, the first RDL coupled to the first die via a second device interconnect that is different from the first device interconnect.

2. The device of claim 1, further comprising a third die coupled to the first RDL, opposite the first die and proximate the second die.

3. The device of claim 1, further comprising:
   a molding compound on the second surface of the RDL substrate and the first die;
   a second RDL in the RDL substrate;
   a first through mold via (TMV) coupled to the first RDL;
   a second TMV coupled to the second RDL; and
   the first passive component comprises a 3D inductor comprising a trace on a surface of the molding compound and coupled to the first TMV and the second TMV.

4. The device of claim 1, in which the first die comprises an antenna module.

5. The device of claim 1, in which the second passive component comprises a metal-insulator-metal (MIM) capacitor.

6. The device of claim 5, in which the first passive component comprises an inductor coupled to the MIM capacitor.

7. The device of claim 1, in which the device comprises a radio frequency (RF) filter.

8. The device of claim 1, in which the device comprises a radio frequency front-end (RFFE) module.

* * * * *